(12) United States Patent
Simsarian et al.

(10) Patent No.: US 6,950,450 B2
(45) Date of Patent: Sep. 27, 2005

(54) CONTROL CIRCUIT FOR A TUNABLE LASER

(75) Inventors: John E. Simsarian, New York City, NY (US); Yikai Su, Eatontown, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 291 days.

(21) Appl. No.: 10/323,495

(22) Filed: Dec. 18, 2002

(65) Prior Publication Data

US 2004/0120372 A1 Jun. 24, 2004

(51) Int. Cl.$^7$ ................................................ H01S 3/10
(52) U.S. Cl. ................ 372/20; 372/38.02; 372/29.015; 372/46
(58) Field of Search ............................... 372/20, 38.02, 372/29.015

(56) References Cited

U.S. PATENT DOCUMENTS

| | | | | |
|---|---|---|---|---|
| 6,788,719 B2 | * | 9/2004 | Crowder | 372/38.02 |
| 2002/0130252 A1 | * | 9/2002 | Funakawa | 250/226 |

OTHER PUBLICATIONS

Chan et al. in IEEE Photonics Technology Letters, vol. 13, No. 7, Jul. 2001 (A fast 100–Channel Wavelength–Tunable Transmitter for Optical packet Switching Article), p. 729–731.*

"Fast Packet Routing in a 2.5 Tb/s Optical Switch Fabric with 40 Gb/s Duobinary Signals at 0.8 b/sHz Spectral Efficiency," by M. Duelk, et al., Proceedings of Optical Fiber Conference, OFC 2003, Paper PD08, Mar. 27, 2003.

"Long–Term Wavelength Switching Measurements with Random Schedules on Fast Tunable Lasers," by A. Bhardwaj, et al., ECOC 2002 Proceedings of European Conference on Optical Communications, Sep. 12, 2002.

"A Widely Tunable Laser Transmitter with Fast, Accurate Switching Between all Channel Combinations," by J.E. Simsarian, et al., ECOC 2002 Proceedings of European Conference on Optical Communications, Sep. 10, 2002.

"Demonstration of A 1 Tb/s Optical Packet Switch Fabric (80* 12.5 Gb/s), Scalable to 128 Tb/s (6400 * 20 Gb/s)," by Jürgen Gripp, et al., ECOC 2000 Proceedings of European Conference on Optical Communications, Post Deadline Paper 2.7, 2000.

(Continued)

*Primary Examiner*—Minsun O. Harvey
*Assistant Examiner*—Dung Nguyen (57) ABSTRACT

A control circuit for a tunable laser has a logic circuit configured to generate a plurality of digital control signals using a table of calibration parameters stored in that circuit. The logic circuit receives an input signal specifying, e.g., an optical communication channel, retrieves the corresponding parameter values from the table of calibration parameters, and generates the digital control signals that are digital-to-analog converted, amplified, and applied to the tunable laser. The table of calibration parameters may be custom-generated for each particular tunable laser to accommodate laser-to-laser variations. In addition, the table of calibration parameters may be periodically updated to correct for wavelength drifting due to laser aging. A control circuit of the invention can be configured to update the table of calibration parameters in a non-disruptive continuous manner while the tunable laser controlled by the circuit is used for data transmission. Certain control circuits of the invention can support channel-to-channel switching times on the order of 50 ns.

20 Claims, 8 Drawing Sheets

OTHER PUBLICATIONS

"Demonstration of a 1.2 Tb/s Optical Packet Switch Fabric (32 * 40 Gb/s) based on 40 Gb/s Burst–Mode Clock–Data–Recovery, Fast Tunable Lasers, and a high performance N×N AWG," by J. Gripp, et al., ECOC 2001 Proceedings of European Conference on Optical Communications, Paper ThA4.8, Oct. 2001.

"4×4 Demonstration of A 1.2 Tb/s (32×40 Gb/s) Optical Switch Fabric for Multi–Tb/s Packet Routers," by J. Gripp, et al., ECOC 2002 Proceedings of European Conference on Optical Communications, Paper PD 2.4, Sep. 12, 2002.

"Next Generation Packet Routers," by M. Duelk, et al., Proceedings SPIE 4872, Optical Transmission Systems and Equipment for WDM Networking, Jul. 2002.

"A Fast 100–Channel Wavelength–Tunable Transmitter for Optical Packet Switching," by Chun–Kit Chan ,et al., IEEE Photonics Technology Letters, vol. 13, No. 7, Jul. 2001, pp. 729–731.

"Fast Switching Characteristics of a Widely Tunable Laser Transmitter," by John E. Simsarian, et al., Submitted to Photonics Technology Letters Dec. 10, 2002.

"Electrical Switching Characteristics of a Wavelength–Tunable Laser: Circuit Modeling, Simulation and Experiment," by Yikai Su, et al., Submitted to Photonics Technology Letters.

"Optical Switch Fabric for Ultra–High Capacity IP–Routers," by Jürgen Gripp, et al., Submitted to: Journal of Lightwave Technology, IEEE 2002.

"Optical Switch Fabrics for Terabit–Class Routers and Packet Switches," Submitted to Journal of Optical Networking, Copyright 2003, Optical Society of America.

"Demonstration of Stabel Wavelength Switching on a Fast Tunable Laser Transmitter," by Ashish Bhardwaj, et al., To be published by Photonics Technology Letters.

* cited by examiner

FIG. 10

CONTROL CIRCUIT FOR A TUNABLE LASER

BACKGROUND OF THE INVENTION

1. Field of the Invention

The present invention relates to optical communication equipment.

2. Description of the Related Art

An optical communication system such as, for example, a Dense Wavelength Division Multiplexed (DWDM) communication system, may employ tunable lasers to generate optical signals corresponding to different communication channels of that system. A representative DWDM system may be configured to have 32 equally-spaced DWDM communication channels, e.g., occupying a wavelength range of about 25 nm from 1528 nm to 1553 nm. Each tunable laser in such a system would typically be capable of generating optical signals for each of the communication channels.

Figure 1:
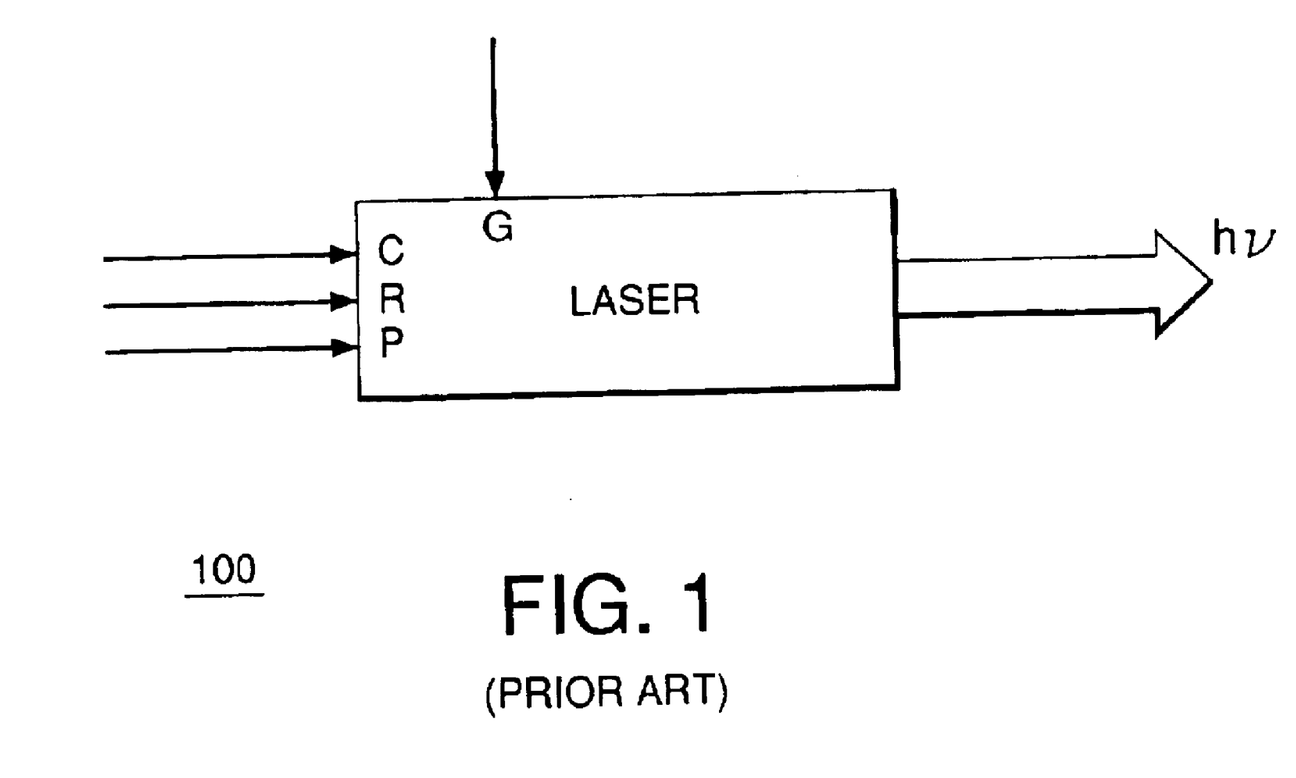
FIG. 1 schematically shows a representative tunable semiconductor laser.

FIG. 1 schematically shows a representative tunable semiconductor laser 100 that can be deployed in a DWDM system. Laser 100 is a distributed Bragg-reflector (DBR) laser such as, for example, a sampled grating DBR (SG-DBR) laser or a grating-assisted co-directional coupler with rear-sampled reflector (GCSR) laser. Laser 100 is controlled by four control signals (typically currents) labeled G, C, R, and P in FIG. 1, each control signal applied to a different section of laser 100. Signal G (gain) controls the output power of laser 100, and signals C (coupler), R (reflector), and P (phase) control the output wavelength of laser 100. By appropriately changing signals C, R, and P, laser 100 can be tuned from one wavelength to another on a nanosecond time scale.

One problem with laser 100 is that, due to slight variations in the manufacturing process, different lasers 100 typically requires different combinations of control-signal amplitudes to generate light at a particular wavelength. In addition, for each wavelength, the combination of control-signal amplitudes will change over time due to the effects of aging. Laser control circuits (e.g., for supplying signals C, R, and P) that can efficiently accommodate device-to-device and/or aging variations are not currently available.

Another problem with laser 100 is that laser control circuits that are available support much slower switching (tuning) speeds than those physically sustainable by laser 100. For example, a widely tunable laser transmitter model 4245 available from Agility Communications, Inc., of Santa Barbara, Calif., can be switched between two different DWDM channels in as much time as about 10 ms.

SUMMARY OF THE INVENTION

The problems in the prior art are addressed in accordance with the principles of the present invention by a control circuit for a tunable laser. The control circuit has a logic circuit configured to generate a plurality of digital control signals using a table of calibration parameters stored in that circuit. The logic circuit receives an input signal specifying, e.g., an optical communication channel, retrieves the corresponding parameter values from the table of calibration parameters, and generates the digital control signals that are digital-to-analog converted, amplified, and applied to the tunable laser. The table of calibration parameters is custom-generated for each particular tunable laser to accommodate laser-to-laser variations. In addition, the table of calibration parameters is periodically updated to correct possible wavelength drifting due to laser aging. A control circuit of the invention can be configured to update the table of calibration parameters in a non-disruptive continuous manner while the tunable laser controlled by the circuit is used for data transmission. Certain control circuits of the invention can support channel-to-channel switching times on the order of 50 ns.

According to one embodiment, the present invention is an apparatus for providing a control signal to a tunable laser, comprising a logic circuit adapted to store a table of calibration parameters corresponding to the tunable laser, wherein, in response to a first input signal and based on the table of calibration parameters, the apparatus generates the control signal for controlling output wavelength of the tunable laser.

According to another embodiment, the present invention is an optical transmitter, comprising: (A) a tunable laser, whose output wavelength is controlled by a control signal; and (B) an apparatus for providing the control signal to the tunable laser, comprising a logic circuit adapted to store a table of calibration parameters corresponding to the tunable laser, wherein, in response to a first input signal and based on the table of calibration parameters, the apparatus generates the control signal for controlling the output wavelength of the tunable laser.

According to yet another embodiment, the present invention is a method of controlling output wavelength of a tunable laser, comprising: (A) receiving an input representative of a desired output wavelength; and (B) based on the desired output wavelength and a table of calibration parameters corresponding to the tunable laser, generating a control signal for tuning the tunable laser to the desired output wavelength.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 2:
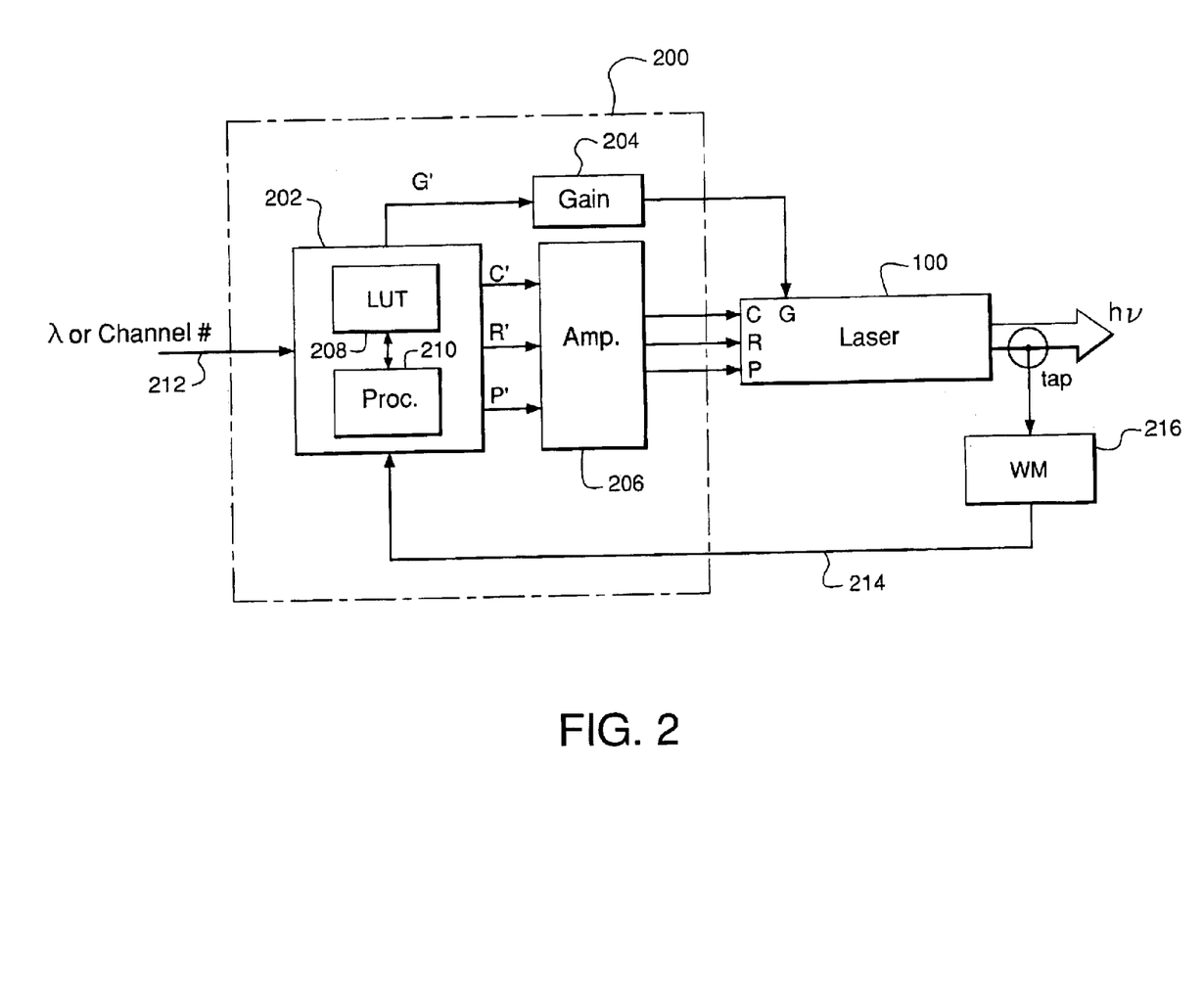
FIG. 2 shows a block diagram of a control circuit for the laser of FIG. 1 according to one embodiment of the present invention.

FIG. 2 shows a block diagram of a control circuit 200 for laser 100 according to one embodiment of the present invention. Circuit 200 receives an input signal 212 and generates four output signals, which are applied to laser 100 as control signals G, C, R, and P. Signals G, C, R, and P may also be considered as parts of a multi-part control signal. In one implementation, signal 212 specifies a wavelength. In another implementation, signal 212 specifies a channel number of the communication system having laser 100. Using the control signals, laser 100 produces an optical output having an appropriate wavelength corresponding to signal 212.

In addition to signal 212, circuit 200 receives an optional feedback signal 214 generated by a wavelength monitor (WM) 216. Monitor 216 is coupled to the output of laser 100 using an optical tap. In one embodiment, signal 214 is a digital signal and monitor 216 is a wavelength/power monitor based on a Fabry-Perot interferometer, a slope filter, or an arrayed waveguide grating. In another embodiment, monitor 216 is part of a monitoring system disclosed in commonly assigned U.S. patent application Ser. No. 10/135, 785 filed on Apr. 30, 2002, the teachings of which are incorporated herein by reference. Based on signal 214, circuit 200 determines the actual output wavelength of laser 100 and adjusts control signals C, R, and P such that the difference between the actual output wavelength of laser 100 and the wavelength specified by signal 212 becomes less than a certain threshold value.

Circuit 200 includes a logic circuit 202, a gain control circuit 204, and an amplifier block 206. Circuit 202 receives signal 212 and optionally signal 214 and generates four digital control signals labeled G', C', R', and P' in FIG. 2. Signal G' is applied to circuit 204, where it is digital-to-analog (D/A) converted and amplified to generate analog control signal G for laser 100. Similarly, digital signals C', R', and P' are applied to block 206, where they are D/A converted and amplified to generate analog control signals C, R, and P, respectively. Circuit 204 may be implemented using slower (less expensive) electronics than those in block 206. Such relatively slow electronics may be used for circuit 204 because, under typical operating conditions, the optical power of laser 100 does not need to be changed often. In contrast, the output wavelength (communication channel) of laser 100 may have to be changed (tuned) as often as once a microsecond. Consequently, block 206 is preferably implemented using relatively fast electronics to support fast tuning speeds. In alternative embodiments, however, circuit 204 is part of block 206 and employs fast electronics.

Circuit 202 includes a look-up table (LUT) 208 and an optional processor 210. LUT 208 is configured to store a table of parameters for laser 100. In one configuration, the table of parameters has at least three parameter values for each communication channel. Based on these parameter values, circuit 200 generates control signals C, R, and P of appropriate amplitudes for laser 100 to produce an optical output corresponding to the communication channel. In one implementation, the table of parameters stored in LUT 208 is generated using a calibration table provided by the laser manufacturer. In another implementation, the table of parameters is generated independently by circuit 202 based on signal 214, e.g., using processor 210. Circuit 202 may be implemented using a field-programmable gate array (FPGA), an application-specific integrated circuit (ASIC), or other suitable processing device.

Figure 3:
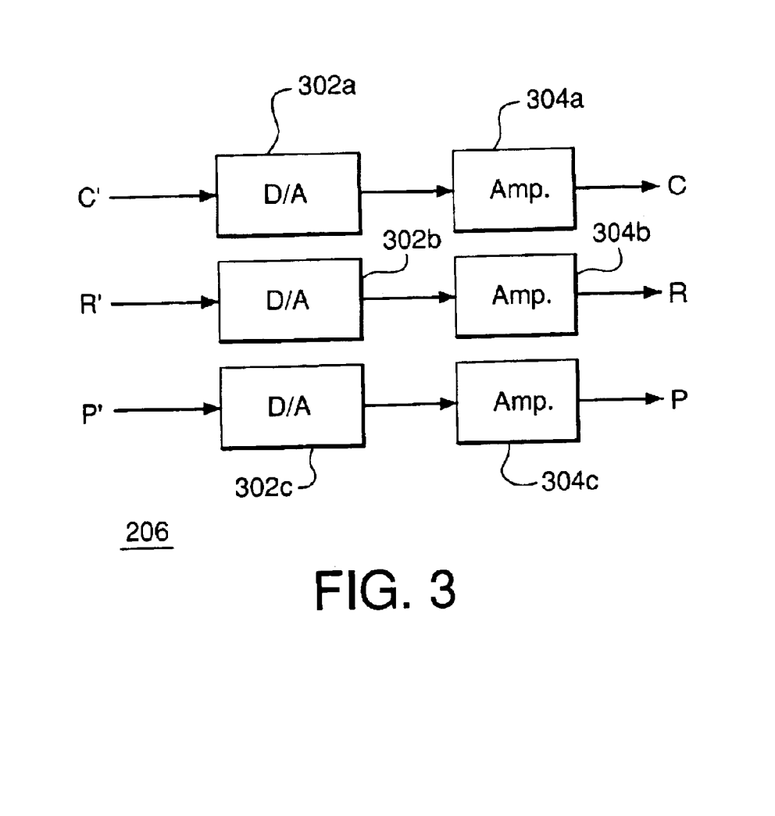
FIG. 3 shows a block diagram of an amplifier block for the control circuit of FIG. 2 according to one embodiment of the present invention.

FIG. 3 shows amplifier block 206 according to one embodiment of the present invention. Block 206 has at least three amplifier channels, each channel corresponding to a different control signal. Each amplifier channel has a D/A converter (DAC) 302 and an amplifier 304. A digital output signal (C', R', or P') of circuit 202 is converted by the corresponding DAC 302 into an analog signal, which is then amplified by amplifier 304 to generate the corresponding analog control signal (C, R, or P) for laser 100.

Figure 4:
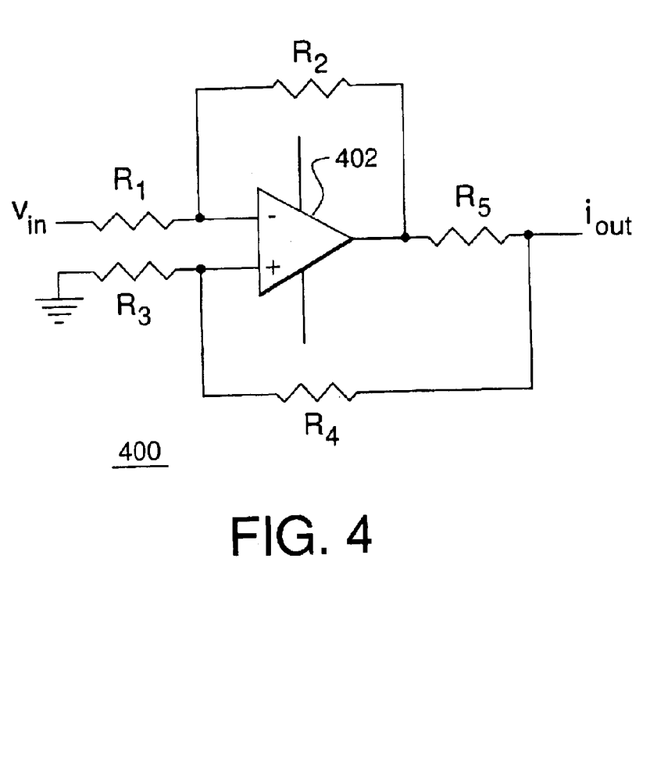
FIG. 4 shows a schematic diagram of an amplifier for the amplifier block of FIG. 3 according to one embodiment of the present invention.

FIG. 4 shows an amplifier 400 that can be used to implement each amplifier 304 according to one embodiment of the present invention. Amplifier 400 includes an operational amplifier 402 and five resistors labeled $R_1$-$R_5$ in FIG. 4. In one configuration, in which $R_1$, $R_2$, $R_3$, $R_4 \gg R_5$, amplifier 400 has high output impedance. The output current ($i_{out}$) generated by amplifier 400 depends substantially linearly on the input voltage ($V_{in}$). In one configuration, in which $R_1=R_3=R_2=R_4$, the output current of amplifier 400 can be expressed as follows:

$$i_{out} = -V_{in}/R_5 \qquad (1)$$

Figure 5:
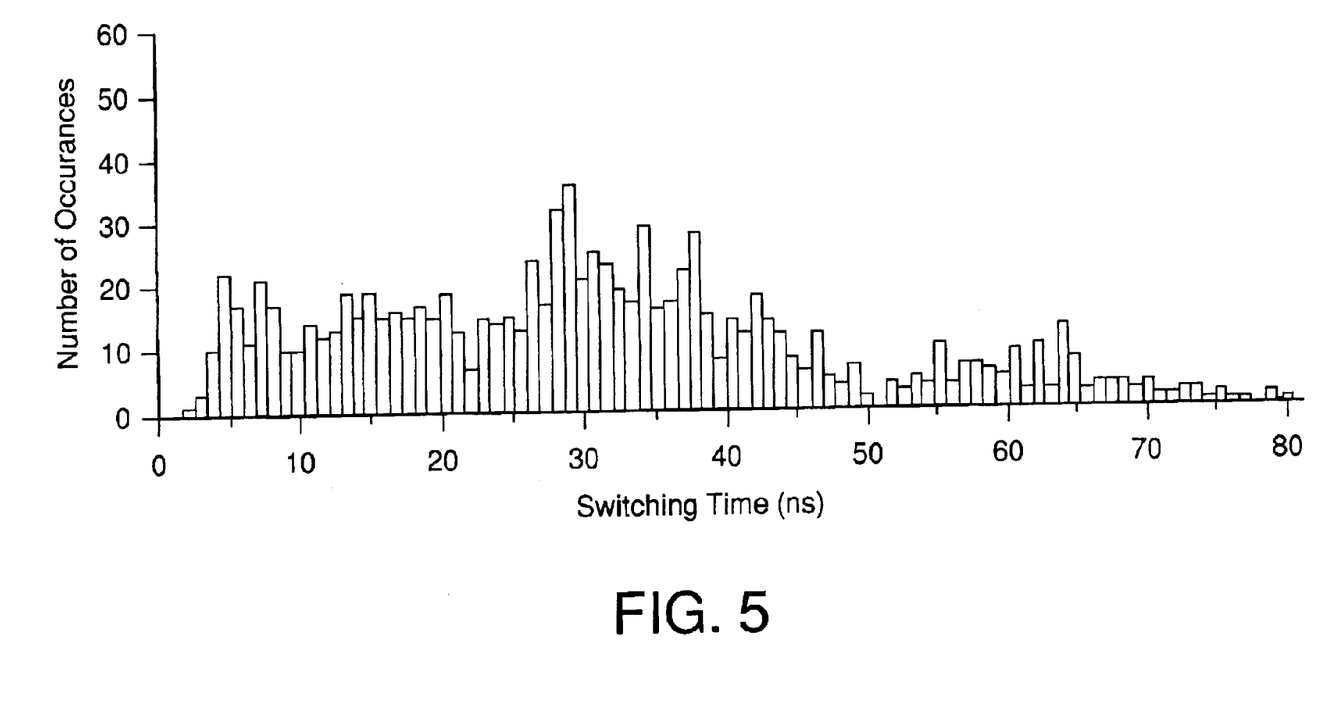
FIG. 5 graphically illustrates the tuning speed realized by the laser of FIG. 1 driven by the control circuit of FIG. 2 having three amplifiers of FIG. 4.

FIG. 5 graphically illustrates the tuning speed realized by laser 100 driven by circuit 200 having three amplifiers 400 in block 206. More specifically, FIG. 5 is a histogram representing the distribution of channel-to-channel switching times realized by laser 100 for 32 DWDM communication channels, a total of 992 channel-to-channel switching combinations. Each switching time was determined as a time interval for laser 100 to tune its output wavelength from that of a source channel to within 0.08 nm of the wavelength corresponding to a destination channel. The data of FIG. 5 demonstrate that a maximum switching time is about 80 ns, with the mean switching time being around 30 ns, which is a significant improvement over the 10-ms switching time for a prior art circuit.

Figure 6:
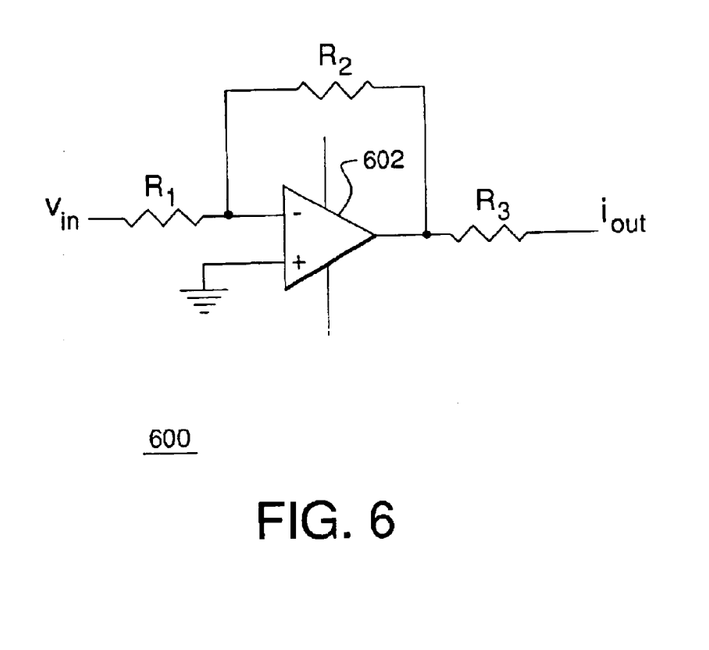
FIG. 6 shows a schematic diagram of an amplifier for the amplifier block of FIG. 3 according to another embodiment of the present invention.

FIG. 6 shows an amplifier 600 that can be used to implement one or more of amplifiers 304 according to another embodiment of the present invention. Amplifier 600 includes an operational amplifier 602 and three resistors labeled $R_{1-R3}$ in FIG. 6. The output impedance of amplifier 600 is substantially equal to $R_3$. Therefore, in a configuration, in which the value of $R_3$ is relatively low, e.g., 20 Ohm, amplifier 600 has low output impedance. In contrast with amplifier 400, when coupled to laser 100 (a non-linear diode), the output current ($i_{out}$) generated by amplifier 600 is not a linear function of the input voltage ($V_{in}$). This nonlinearity is beneficial, when the output wavelength of laser 100 does not change linearly with the amplitude of any one control signal, the amplitudes of other two control signals being constant. The nonlinearity substantially compensates for the tuning nonlinearity of laser 100 such that the output wavelength of the laser becomes substantially proportional to the value of the corresponding digital control signal (C', R', or P' in FIGS. 2 and 3).

Figure 7:
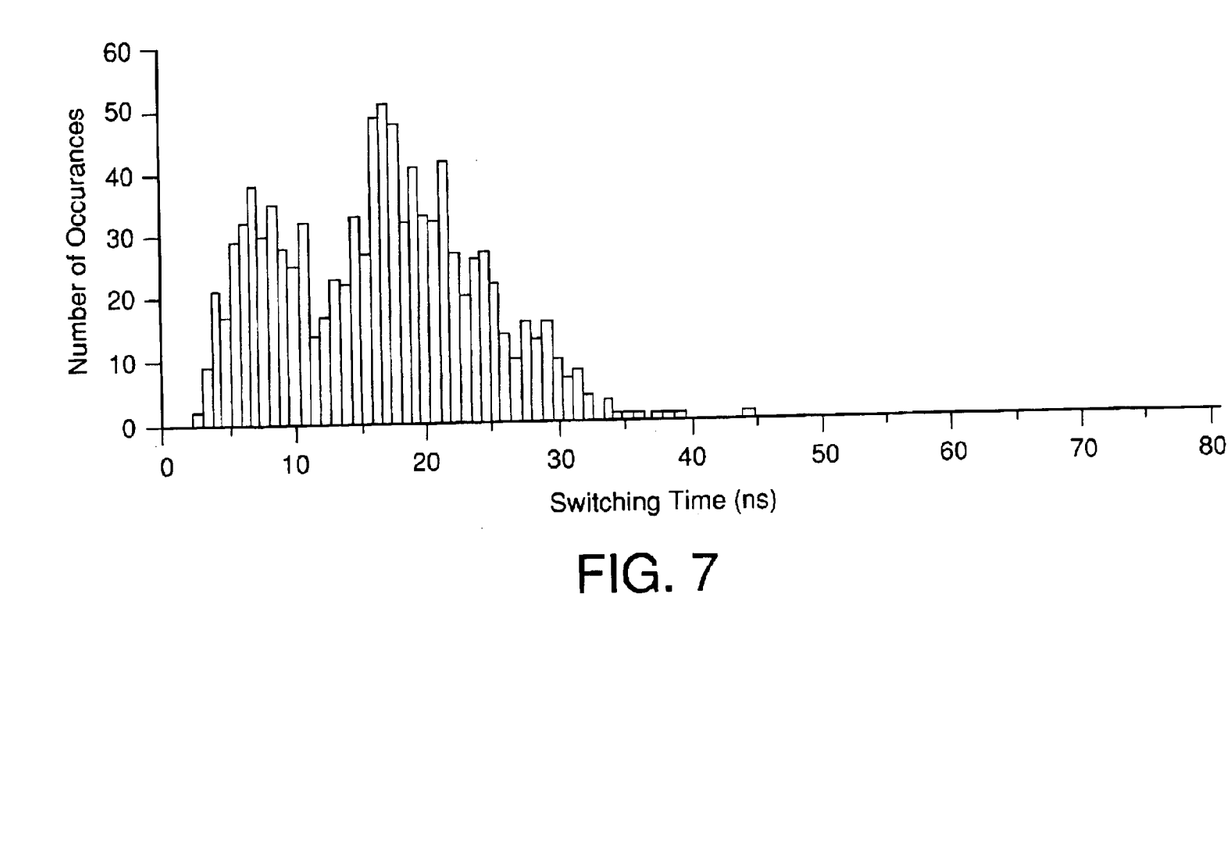
FIG. 7 graphically illustrates the tuning speed realized by the laser of FIG. 1 driven by the control circuit of FIG. 2 having two amplifiers of FIG. 4 and one amplifier of FIG. 6.

FIG. 7, which is similar to FIG. 5, graphically illustrates the tuning speed realized by laser 100 driven by circuit 200 having, in block 206, two amplifiers 400 and one amplifier 600. More specifically, each of amplifiers 304a and 304c (FIG. 3) is amplifier 400, and amplifier 304b is amplifier 600. The data of FIG. 7 demonstrate that a maximum switching time is about 45 ns, with the mean switching time being around 17 ns. This improvement is mostly due to the reduced output impedance of amplifier 304b, which reduces the effective time constant related to the switching time.

Figure 8:
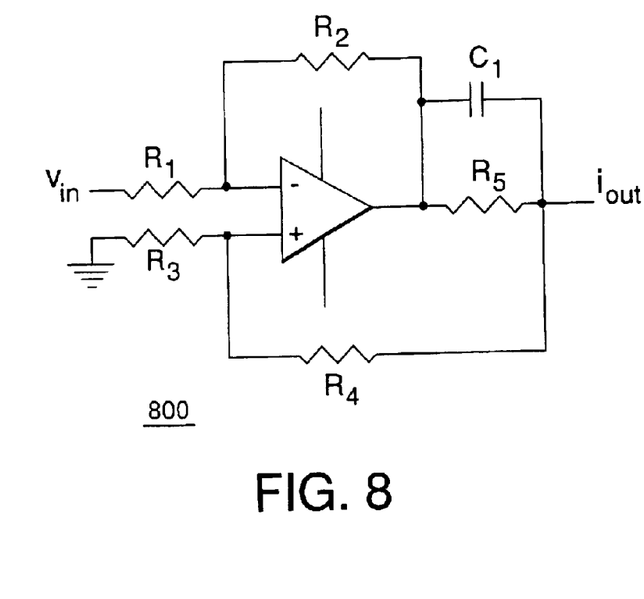
FIG. 8 shows a schematic diagram of an amplifier for the amplifier block of FIG. 3 according to yet another embodiment of the present invention.

FIG. 8 shows an amplifier 800 that can be used to implement one or more of amplifiers 304 according to yet another embodiment of the present invention. Amplifier 800 is similar to amplifier 400. However, in addition to circuit elements used in amplifier 400, amplifier 800 has a capacitor (labeled $C_1$ in FIG. 8) in parallel with resistor $R_5$. Having at least one amplifier 800 in block 206 improves the switching performance of circuit 200 compared to that of circuit 200 having in block 206 amplifiers 400 only. For example, circuit 200 configured with three amplifiers 800 may have high output impedance for each amplifier channel in block 206 and, in addition, a switching performance comparable to that illustrated in FIG. 7.

Figure 9A:
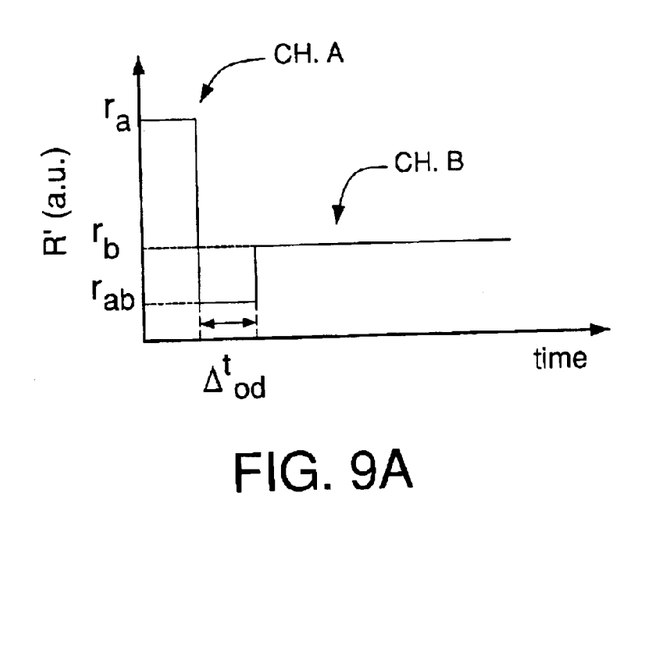
FIGS. 9A–B graphically illustrate a method of switching the laser of FIG. 1 using the circuit of FIG. 2 according to one embodiment of the present invention.
Figure 9B:
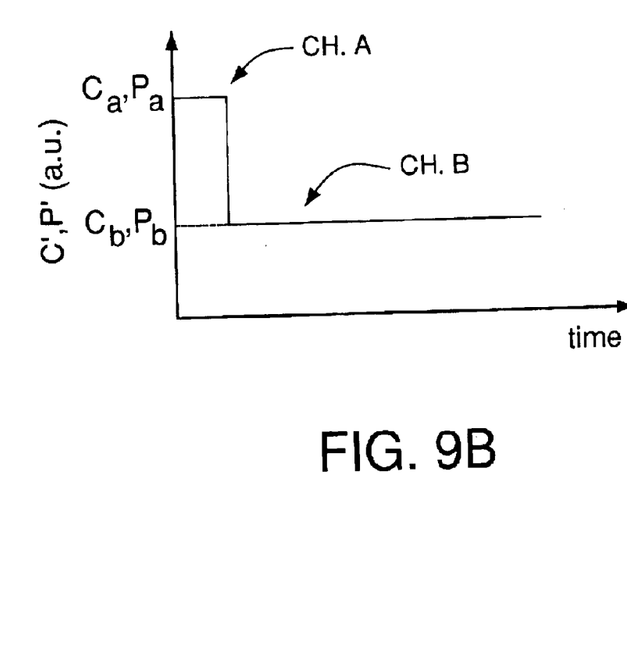

FIG. 9 graphically illustrates a method of switching laser 100 between two communication channels (e.g., from source channel A to destination channel B) according to one embodiment of the present invention. More specifically, FIGS. 9A–B show time profiles of digital control signals R' (FIG. 9A) and C' and P' (FIG. 9B) generated by circuit 202, when laser 100 is switched from channel A to channel B. The values of signals C' and P' (FIG. 9B) are changed in one step from $c_a$ and $p_a$ to $c_b$ and $p_b$, respectively, where subscripts a and b indicate the values of the digital control signals corresponding to channels A and B, respectively. The value of signal R' (FIG. 9A) is changed from $r_a$ to $r_b$ in at least two steps. For example, in a first step, the value of signal R' is changed from $r_a$ to $r_{ab}$ and, in a second step, it is changed from $r_{ab}$ to $r_b$, where $r_{ab}$ is an overdrive value. The value of signal R' is held at $r_{ab}$ for a time period $\Delta t_{od}$.

The inventors' own research demonstrated that using the time profiles shown in FIG. 9 improves switching speed for laser 100 driven by circuit 200, in which block 206 has three amplifiers 400. For example, for a representative communication channel pair, the switching time is reduced by about 10 ns (e.g., from about 50 ns to about 40 ns), when the method illustrated in FIG. 9 is implemented using the following parameters: $\Delta t_{od}=10$ ns and $r_{ab}=r_b-0.4(r_a-r_b)$.

In one embodiment, the method of FIG. 9 is modified to apply overdriving (e.g., a two-step time profile) to a different control signal, e.g., signal C' or P'. In addition, two or more control signals may be switched using overdriving.

Table 1 is an example of a calibration table (calibration data) for three representative communication channels that may be provided by the laser manufacturer. For each communication channel, optical frequency (in THz) and the recommended amplitudes of three analog control signals C, R, and P for laser 100 are indicated. More specifically, in this example, each analog control signal is a current given in mA, where maximum possible currents are 30, 20, and 5 mA for currents C, R, and P, respectively.

TABLE 1

Calibration Table for Laser 100.

| Channel # | Freq. (THz) | Signal C (mA) | Signal R (mA) | Signal P (mA) |
|---|---|---|---|---|
| 1 | 196.0 | 14.75 | 6.50 | 1.84 |
| 2 | 195.9 | 14.40 | 4.91 | 1.11 |
| 3 | 195.8 | 14.25 | 3.60 | 1.67 |

Table 2 is a table of calibration parameters stored in LUT 208 according to one implementation. More specifically, Table 2 is generated using Table 1 and, for each communication channel, includes values for digital control signals C', R', and P'. Each value is stored in a 10-bit format resulting in an approximate resolution for analog control signals C, R, and P of 30, 20, and 5 μA, respectively. The resolution represents a minimum available increment for the corresponding analog control signal.

TABLE 2

Table of Calibration Parameters for Laser 100 Stored in LUT 208.

| Channel # | Signal C' | Signal R' | Signal P' |
|---|---|---|---|
| 1 | 503 | 333 | 376 |
| 2 | 491 | 251 | 228 |
| 3 | 486 | 184 | 341 |

Different methods can be used to generate an initial table of calibration parameters before laser 100 is deployed in a communication system. For example, the initial table of calibration parameters can be generated using calibration data provided by the manufacturer (e.g., Table 1), wavelength monitor 216, or a third party wavelength calibration system. After laser 100 is deployed in the communication system, the table of calibration parameters can be updated using wavelength monitor 216.

Figure 10:
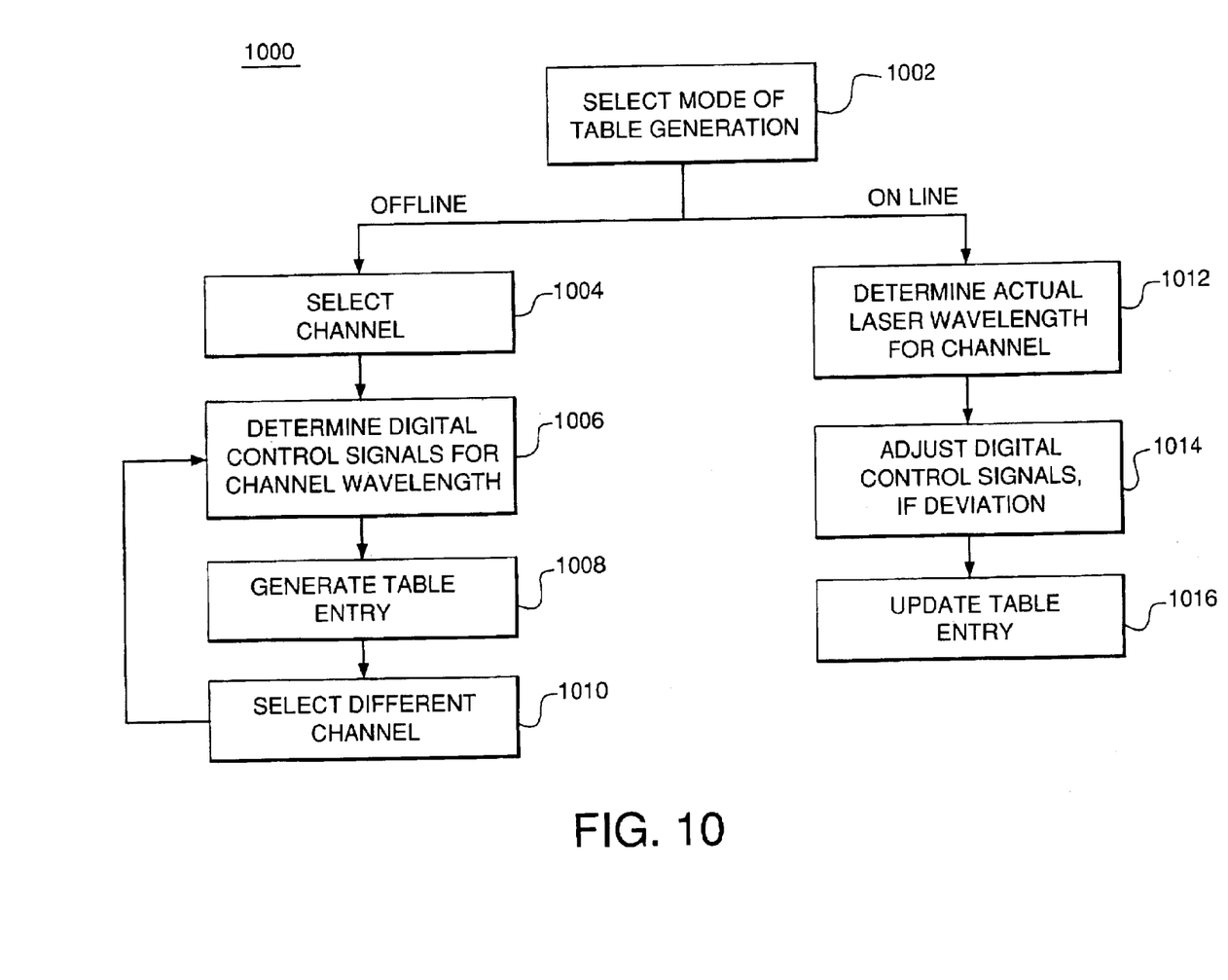
FIG. 10 shows a flow diagram of a method of generating a table of parameters for the control circuit of FIG. 2 according to one embodiment of the present invention.

FIG. 10 schematically shows a method 1000 of generating/updating a table of calibration parameters for laser 100 using monitor 216 (see FIG. 2) according to one embodiment of the present invention. In step 1002 of method 1000, a mode, in which the table of calibration parameters is generated, is selected. Two exemplary modes, e.g., an online mode and an offline mode, are illustrated in FIG. 10. The offline mode is a service mode, during which transmission of data using laser 100 is interrupted. The online mode is a non-disruptive mode performed in the background while user data is transmitted using laser 100. In one embodiment, an external controller (not shown) generates a control signal for circuit 200 indicating the offline mode of table generation. In one embodiment, the online mode is controlled internally in circuit 200, e.g., using processor 210. In different implementations of method 1000, additional and/or different modes of generating the table of calibration parameters for laser 100 may be utilized.

If the offline mode is selected in step 1002, then an outside controller selects a communication channel and provides the selection to circuit 202 via signal 212 in step 1004. In step 1006, using signal 214, circuit 202 determines a combination of values for digital control signals C', R', and P' corresponding to the selected communication channel. The determined combination is preferably located near a center of a corresponding laser-mode stability region, i.e., relatively far from the laser-mode hop boundary for that mode of laser 100. In step 1008, the determined combination is stored in LUT 208. In step 1010, a different communication channel is selected and steps 1006 and 1008 are repeated for that channel. The procedure is terminated, for example, when, for each communication channel, a corresponding entry in the table of calibration parameters has been generated.

In one implementation, all communication channels are characterized using the offline mode in a single continuous block of time. In a different implementation, the communication system is configured to resume its normal operation (e.g., data transmission) for a period of time between steps 1008 and 1010. For example, a single one-microsecond time slot may be allocated for performing steps 1006 and 1008 for one communication channel. Then, the normal operation may resume for the next 10,000 one-microsecond time slots before steps 1006 and 1008 are performed for a next communication channel. This would minimize disruptions to the data flow in the communication system.

In situations where laser 100 is relatively stable (e.g., undergoes small wavelength drifting relatively far from a mode hop), the online mode may be selected in step 1002. Based on the current table of calibration parameters and signal 212, circuit 200 generates control signals C, R, and P applied to laser 100. In step 1012, based on signal 214, processor 210 determines an actual output wavelength of laser 100. In addition to the table of calibration parameters, for each communication channel, circuit 202 stores a wavelength assigned to that communication channel. Based on signal 212, processor 210 retrieves the corresponding assigned communication-channel wavelength and determines the difference between the actual and assigned wavelengths. If the wavelength difference exceeds a certain threshold value, circuit 202 adjusts the values of one or more digital control signals such that the wavelength difference falls below the threshold value. In step 1016, a corresponding entry in the table of calibration parameters is updated in LUT 208 to store the adjusted values for digital control signals. As laser 100 is tuned to different communication channels during data transmission, potentially all entries in the table of calibration parameters stored in LUT 208 may eventually be updated during step 1016 to compensate for laser wavelength drifting.

If laser 100 approaches or undergoes a mode hop, the table of calibration parameters may be regenerated, e.g., using the offline mode (steps 1004–1010) as described above. Then, the online mode may resume. Regenerations of the table of calibration parameters may be scheduled using a fixed time schedule and/or using laser mode stability data (e.g., the occurrence of mode hops).

While this invention has been described with reference to illustrative embodiments, this description is not intended to be construed in a limiting sense. Various modifications of the described embodiments, as well as other embodiments of the invention, which are apparent to persons skilled in the art to which the invention pertains are deemed to lie within the principle and scope of the invention as expressed in the following claims.

For example, depending on the laser, a control circuit of the invention may be designed to generate a different number of control signals, for example, more or fewer than four. In addition, it may be configured to provide control signals corresponding to non-uniformly spaced optical channels, the number of which may be different from 32. Different control signals may be multiplexed into a single control signal as known in the art. Furthermore, a control circuit of the invention may be configured to control a different type of laser or a non-laser. The laser may have its own D/A converters and amplifiers, in which case the digital control signals, e.g., signals C', R', and P' in FIG. 2, can be applied directly to the laser.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. An apparatus for providing a control signal to a tunable laser, comprising:

a logic circuit adapted to store a table of calibration parameters corresponding to the tunable laser, wherein, in response to a first input signal and based on the table of calibration parameters, the apparatus generates the control signal for controlling output wavelength of the tunable laser; and an amplifier block coupled between the logic circuit and the tunable laser, wherein the amplifier block receives a signal from the logic circuit and generates the control signal applied to the tunable laser, wherein the amplifier block includes:

(i) a digital-to-analog converter (DAC) receiving the signal from the logic circuit; and (ii) an amplifier coupled to the output of the DAC and generating the control signal applied to the tunable laser, wherein the amplifier is designed to compensate for wavelength tuning nonlinearity of the tunable laser such that a change in the output wavelength is substantially proportional to a chance in the value of the signal from the logic circuit.

2. The apparatus of claim 1, wherein the tunable laser is a distributed Bragg-reflector (DBR) laser and the apparatus is designed to generate coupler, reflector, and phase control signals for controlling the output wavelength.

3. The apparatus of claim 1, wherein the control signal is part of a multi-part control signal generated by the apparatus.

4. The apparatus of claim 1, wherein the table of calibration parameters is based on calibration data for the tunable laser.

5. The apparatus of claim 1, wherein the logic circuit is configured to receive a second input signal from a wavelength monitor coupled to the output of the tunable laser and the table of calibration parameters is generated using the second input signal.

6. The apparatus of claim 5, wherein, for each optical channel, the logic circuit stores an assigned wavelength and, based on the second input signal, generates parameter values for the table of calibration parameters, using which values the apparatus is configured to generate the control signal corresponding to the assigned wavelength.

7. The apparatus of claim 1, wherein, when the output wavelength is to be tuned, the control signal is changed from a source value to a destination value in at least two steps such that the control signal has a transient value outside the range between the source and destination values.

8. An optical transmitter, comprising:

(A) a tunable laser, whose output wavelength is controlled by a control signal; and (B) an apparatus for providing the control signal to the tunable laser, comprising a logic circuit adapted to store a table of calibration parameters corresponding to the tunable laser, wherein, in response to a first input signal and based on the table of calibration parameters, the apparatus generates the control signal for controlling the output wavelength of the tunable laser; and an amplifier block coupled between the logic circuit and the tunable laser, wherein the amplifier block receives a signal from the logic circuit and generates the control signal applied to the tunable laser, wherein the amplifier block includes:

(i) a digital-to-analog converter (DAC) receiving the signal from the logic circuit; and (ii) an amplifier coupled to the output of the DAC and generating the control signal applied to the tunable laser, wherein the amplifier is designed to compensate for wavelength tuning nonlinearity of the tunable laser such that a change in the output wavelength is substantially proportional to a change in the value of the signal from the logic circuit.

9. The transmitter of claim 8, further comprising a wavelength monitor coupled to the output of the tunable laser, wherein the apparatus is configured to receive a second input signal from the wavelength monitor and the table of calibration parameters is generated using the second input signal.

10. The transmitter of claim 9, wherein, for each optical channel, the logic circuit stores an assigned wavelength and, based on the second input signal, generates parameter values for the table of calibration parameters, using which values the apparatus is configured to generate the control signal corresponding to the assigned wavelength.

11. A method of controlling output wavelength of a tunable laser, comprising:

(A) receiving an input representative of a desired output wavelength; and (B) based on the desired output wavelength and a table of calibration parameters corresponding to the tunable laser, generating a control signal for tuning the tunable laser to the desired output wavelength, wherein:
    step (B) comprises generating the control signal using an amplifier designed to compensate for wavelength tuning nonlinearity of the tunable laser such that a change in output wavelength of the tunable laser is substantially proportional to a change in the value of a signal applied to the amplifier.

12. The method of claim 11, further comprising:

(C) generating the table of calibration parameters corresponding to the tunable laser.

13. The method of claim 12, wherein step (C) comprises generating the table of calibration parameters based on feedback from a wavelength monitor coupled to the output of the tunable laser.

14. The method of claim 13, wherein step (C) is performed online while user data is transmitted using the tunable laser.

15. The method of claim 11, wherein step (B) comprises changing the control signal, when the desired output wavelength changes.

16. The method of claim 15, wherein step (B) further comprises changing the control signal from a source value to a destination value in at least two steps such that the control signal has a transient value outside the range between the source and destination values.

17. An apparatus for providing a control signal to a tunable laser, comprising a logic circuit adapted to store a table of calibration parameters corresponding to the tunable laser, wherein:

in response to a first input signal and based on the table of calibration parameters, the apparatus generates the control signal for controlling output wavelength of the tunable laser;

when the output wavelength is to be tuned, the control signal is changed from a source value to a destination value in at least two steps such that the control signal has a transient value outside the range between the source and destination values;

the tunable laser is a distributed Bragg-reflector (DBR) laser; and the control signal includes at least one of coupler, reflector, and phase control signals for controlling the output wavelength.

18. The transmitter of claim 8, wherein, when the output wavelength is to be tuned, the control signal is changed from a source value to a destination value in at least two steps such that the control signal has a transient value outside the range between the source and destination values.

19. An optical transmitter, comprising:

(A) a tunable laser, whose output wavelength is controlled by a control signal; and (B) an apparatus for providing the control signal to the tunable laser, comprising a logic circuit adapted to store a table of calibration parameters corresponding to the tunable laser, wherein:
    in response to a first input signal and based on the table of calibration parameters, the apparatus generates the control signal for controlling the output wavelength of the tunable laser;
    when the output wavelength is to be tuned, the control signal is changed from a source value to a destination value in at least two steps such that the control signal has a transient value outside the range between the source and destination values;
    the tunable laser is a distributed Bragg-reflector (DBR) laser; and
    the control signal includes at least one of coupler, reflector, and phase control signals for controlling the output wavelength.

20. A method of controlling output wavelength of a tunable laser, comprising:

(A) receiving an input representative of a desired output wavelength; and (B) based on the desired output wavelength and a table of calibration parameters corresponding to the tunable laser, generating a control signal for tuning the tunable laser to the desired output wavelength, wherein step (B) comprises:
    changing the control signal, when the desired output wavelength changes; and
    changing the control signal from a source value to a destination value in at least two steps such that the control signal has a transient value outside the range between the source and destination values, wherein:
    the tunable laser is a distributed Bragg-reflector (DBR) laser, and
    the control signal includes at least one of coupler, reflector, and phase control signals for controlling the output wavelength.

* * * * *